(12) United States Patent
Chen et al.

(10) Patent No.: US 9,818,635 B2
(45) Date of Patent: Nov. 14, 2017

(54) CARRIER STRUCTURE, PACKAGING SUBSTRATE, ELECTRONIC PACKAGE AND FABRICATION METHOD THEREOF

(71) Applicant: Siliconware Precision Industries Co., Ltd., Taichung (TW)

(72) Inventors: Lu-Yi Chen, Taichung (TW); Chang-Lun Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/982,142

(22) Filed: Dec. 29, 2015

(65) Prior Publication Data

US 2017/0033027 A1 Feb. 2, 2017

(30) Foreign Application Priority Data

Jul. 31, 2015 (TW) .............................. 104124868 A

(51) Int. Cl.
*H01L 29/40* (2006.01)
*H01L 21/683* (2006.01)
(Continued)

(52) U.S. Cl.
CPC ...... *H01L 21/6835* (2013.01); *H01L 21/4846* (2013.01); *H01L 22/14* (2013.01); *H01L 23/373* (2013.01); *H01L 23/49822* (2013.01); *H01L 23/49827* (2013.01); *H01L 23/49838* (2013.01); *H01L 21/568* (2013.01); *H01L 24/13* (2013.01); *H01L 24/16* (2013.01); *H01L 24/48* (2013.01); *H01L 24/81* (2013.01); *H01L 24/85* (2013.01);
(Continued)

(58) Field of Classification Search
CPC .............. H01L 23/3128; H01L 23/373; H01L 21/6835; H01L 23/49822; H01L 22/14; H01L 25/0655; H01L 1/56; H01L 23/49827; H01L 23/49838
USPC ......................................................... 257/773
See application file for complete search history.

(56) References Cited

U.S. PATENT DOCUMENTS 6,075,710 A * 6/2000 Lau .................... H01L 23/49816
174/255
8,592,958 B2 * 11/2013 Ko ........................ H01L 21/561
257/659

(Continued)

*Primary Examiner* — Xinning Niu
*Assistant Examiner* — Vu A Vu
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, including: a circuit structure having opposite first and second surfaces, wherein first and second circuit layers are formed on the first and second surfaces of the circuit structure, respectively, the first circuit layer having a minimum trace width less than that of the second circuit layer; a separation layer formed on the first surface of the circuit structure; a metal layer formed on the separation layer and electrically connected to the first circuit layer; an electronic element disposed on the first surface of the circuit structure and electrically connected to the metal layer; and an encapsulant formed on the circuit structure to encapsulate the electronic element. By disposing the electronic element having high I/O function on the circuit structure, the invention eliminates the need of a packaging substrate having a core layer and thus reduces the thickness of the electronic package.

11 Claims, 4 Drawing Sheets

(51) Int. Cl.
*H01L 23/498* (2006.01)
*H01L 23/373* (2006.01)
*H01L 21/66* (2006.01)
*H01L 21/48* (2006.01)
H01L 25/065 (2006.01)
H01L 21/56 (2006.01)
H01L 23/00 (2006.01)
H01L 25/16 (2006.01)

(52) U.S. Cl.
CPC .......... *H01L 25/0655* (2013.01); *H01L 25/16* (2013.01); *H01L 2221/68345* (2013.01); *H01L 2221/68381* (2013.01); *H01L 2224/131* (2013.01); *H01L 2224/16227* (2013.01); *H01L 2224/48227* (2013.01); *H01L 2224/81005* (2013.01); *H01L 2224/85005* (2013.01); *H01L 2924/153* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 2013/0187266 A1* | 7/2013 | Chen | H01L 25/105 257/737 |
| 2013/0200528 A1* | 8/2013 | Lin | H01L 21/6836 257/774 |
| 2015/0235949 A1* | 8/2015 | Yu | H01L 23/3128 257/774 |

* cited by examiner

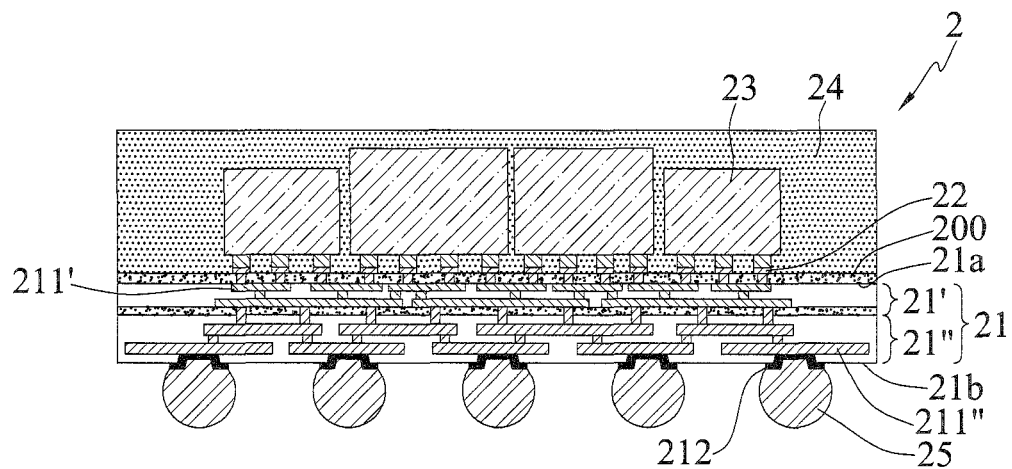
FIG.2G
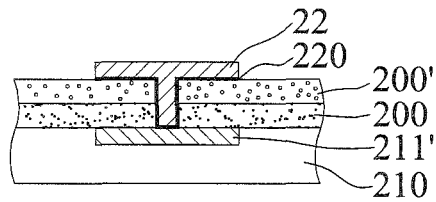
FIG.2G'
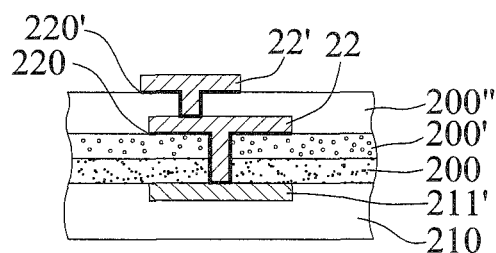
FIG.2G"

CARRIER STRUCTURE, PACKAGING SUBSTRATE, ELECTRONIC PACKAGE AND FABRICATION METHOD THEREOF

CROSS-REFERENCES TO RELATED APPLICATIONS

This application claims under 35 U.S.C. §119(a) the benefit of Taiwanese Application No. 104124868, filed Jul. 31, 2015, the entire contents of which are incorporated herein by reference.

BACKGROUND OF THE INVENTION

1. Field of the Invention

The present invention relates to electronic packages, and more particularly, to an electronic package having a reduced size and a fabrication method thereof.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

FIG. 1 is a schematic cross-sectional view of a conventional 3D chip stacking-type semiconductor package 1. Referring to FIG. 1, a silicon interposer 10 is provided. The silicon interposer 10 has a chip mounting side 10a, an external connection side 10b opposite to the chip mounting side 10a and having a plurality of redistribution layers 101 formed thereon, and a plurality of through silicon vias (TSVs) 100 communicating the chip mounting side 10a and the external connection side 10b. A semiconductor chip 19 having a plurality of electrode pads 190 is disposed on the chip mounting side 10a of the silicon interposer 10 and the electrode pads 190 are electrically connected to the chip mounting side 10a of the silicon interposer 10 through a plurality of solder bumps 102. The electrode pads 190 have a small pitch therebetween. Further, an underfill 192 is formed between the semiconductor chip 19 and the chip mounting side 10a of the silicon interposer 10 for encapsulating the solder bumps 102. Furthermore, an encapsulant 18 is formed on the silicon interposer 10 to encapsulate the semiconductor chip 19. In addition, a packaging substrate 17 having a plurality of bonding pads 170 is disposed on the external connection side 10b of the silicon interposer 10 and the bonding pads 170 are electrically connected to the redistribution layers 101 through a plurality of conductive elements 103 such as bumps. The bonding pads 170 of the packaging substrate 17 have a large pitch therebetween. Also, an underfill 172 is formed to encapsulate the conductive elements 103.

To fabricate the semiconductor package 1, the semiconductor chip 19 is disposed on the silicon interposer 10 first and then the silicon interposer 10 having the semiconductor chip 19 is disposed on the packaging substrate 17 through the conductive elements 103. Subsequently, the encapsulant 18 is formed, thereby obtaining the semiconductor packager 1.

In the conventional semiconductor package 1, the silicon interposer 10 serves as a signal transmission medium between the semiconductor chip 19 and the packaging substrate 17. To achieve a suitable silicon interposer 10, the TSVs 100 must be controlled to have a certain depth to width ratio (100 um/10 um), thus consuming a large amount of time and chemical agent and incurring a high fabrication cost.

Further, the packaging substrate 17 has a core layer containing glass fiber. Consequently, the packaging substrate 17 is quite thick, which hinders miniaturization of the semiconductor package 1.

Furthermore, when the semiconductor chip 19 has features of fine trace width, fine pitch and high I/O count, the area of the silicon interposer 10 and the area of the corresponding packaging substrate 17 must be increased, thereby hindering miniaturization of the semiconductor package 1.

In addition, an electrical test is generally performed after the semiconductor chip 19 is encapsulated by the encapsulant 18. As such, if the redistribution layers 101 fail to function properly, the overall structure cannot be reworked, resulting in a loss of the chip.

Therefore, how to overcome the above-described drawbacks has become critical.

SUMMARY OF THE INVENTION

In view of the above-described drawbacks, the present invention provides an electronic package, which comprises: a circuit structure having a first surface and a second surface opposite to the first surface, wherein a first circuit layer is formed on the first surface of the circuit structure and a second circuit layer is formed on the second surface of the circuit structure, the first circuit layer having a minimum trace width less than that of the second circuit layer; a separation layer formed on the first surface of the circuit structure; a metal layer formed on the separation layer and electrically connected to the first circuit layer; an electronic element disposed on the first surface of the circuit structure and electrically connected to the metal layer; and an encapsulant formed on the circuit structure to encapsulate the electronic element.

The present invention further provides a carrier structure, which comprises: a carrier; a separation layer bonded to the carrier; and a circuit structure having a first surface bonded to the separation layer and a second surface opposite to the first surface, wherein a first circuit layer is formed on the first surface of the circuit structure and a second circuit layer is formed on the second surface of the circuit structure, the first circuit layer having a minimum trace width less than that of the second circuit layer.

Furthermore, the present invention provides a packaging substrate, which comprises: a circuit structure having a first surface and a second surface opposite to the first surface, wherein a first circuit layer is formed on the first surface of the circuit structure and a second circuit layer is formed on the second surface of the circuit structure, the first circuit layer having a minimum trace width less than that of the second circuit layer; a separation layer formed on the first surface of the circuit structure; and a metal layer formed on the separation layer and electrically connected to the first circuit layer.

The present invention also provides a method for fabricating an electronic package, which comprises the steps of: providing a circuit structure having a first surface and a second surface opposite to the first surface and forming a separation layer on the first surface of the circuit structure, wherein the first surface of the circuit structure has a first circuit layer and the second surface of the circuit structure has a second circuit layer, the first circuit layer having a minimum trace width less than that of the second circuit layer; forming a metal layer on the separation layer, wherein the metal layer is electrically connected to the first circuit layer; disposing an electronic element on the first surface of the circuit structure, wherein the electronic element is electrically connected to the metal layer; and forming an encapsulant on the first surface of the circuit structure to encapsulate the electronic element.

In the above-described method, forming the separation layer on the circuit structure comprises: providing a carrier having the separation layer; forming the circuit structure on the separation layer; and removing the carrier. For example, the carrier is made of silicon wafer, and the separation layer serves as an etch stop layer so as to allow the carrier to be removed by grinding and etching. Alternatively, the carrier is made of glass, and the separation layer partially loses its adhesive property through heating or radiation so as to facilitate removal of the carrier.

Before disposing the electronic element, the method can further comprise performing an electrical test to the metal layer and the circuit structure. Before performing the electrical test, the method can further comprise forming a conductive layer on the metal layer.

The above-described package and method can further comprise forming a plurality of conductive elements on the second surface of the circuit structure.

In the above-described carrier structure, packaging substrate, electronic package and fabrication method, the separation layer can be a thermal $SiO_2$ layer or an adhesive layer. The metal layer can be a patterned circuit layer. At least an assisting layer can be formed on the separation layer in a manner that the metal layer is formed on the assisting layer.

The present invention mainly involves disposing an electronic element having high I/O function on the circuit structure so as to eliminate the need of a packaging substrate having a core layer and thus reduce the thickness of the electronic package.

Since the first circuit layer corresponds to the electronic element having fine trace width and pitch and high I/O count, the present invention does not need to increase the area of the circuit structure, thereby facilitating miniaturization of electronic products.

Further, the present invention dispenses with the fabrication of TSVs and therefore reduces the fabrication cost.

Furthermore, an electrical test is performed on the circuit structure before disposing the electronic element so as to reduce loss of the electronic element.

BRIEF DESCRIPTION OF DRAWINGS

FIGS. 2A to 2G are schematic cross-sectional views showing a method for fabricating an electronic package according to the present invention, wherein FIG. 2E' shows another embodiment of FIG. 2E, and FIGS. 2G' and 2G" are schematic partially enlarged views showing other embodiments of FIG. 2G.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2G are schematic cross-sectional views showing a method for fabricating an electronic package 2 according to the present invention.

Figure 1:
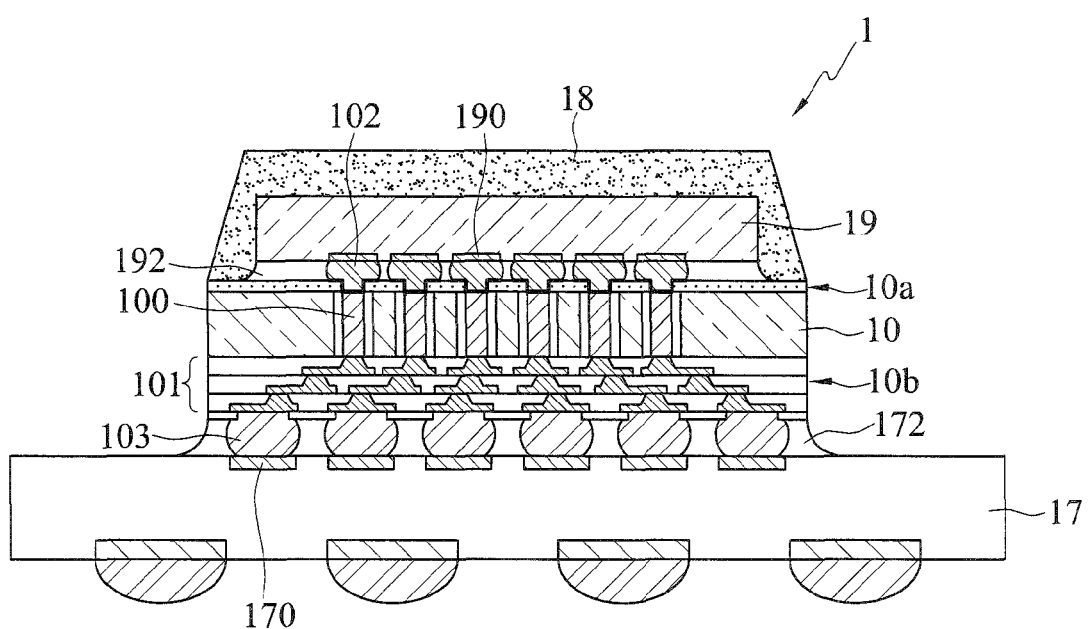
FIG. 1 is a schematic cross-sectional view of a conventional semiconductor package.
Figure 2A:
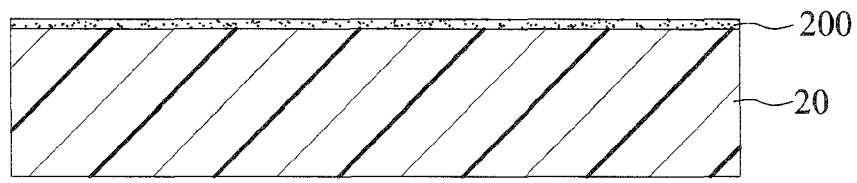

Referring to FIG. 2A, a separation layer 200 is formed on a carrier 20.

In the present embodiment, the carrier 20 is a semiconductor substrate made of, for example, a dummy silicon wafer, glass or polymer. The separation layer 200 is, for example, a thermal $SiO_2$ layer, or an adhesive layer, particularly an organic adhesive layer.

Figure 2B:
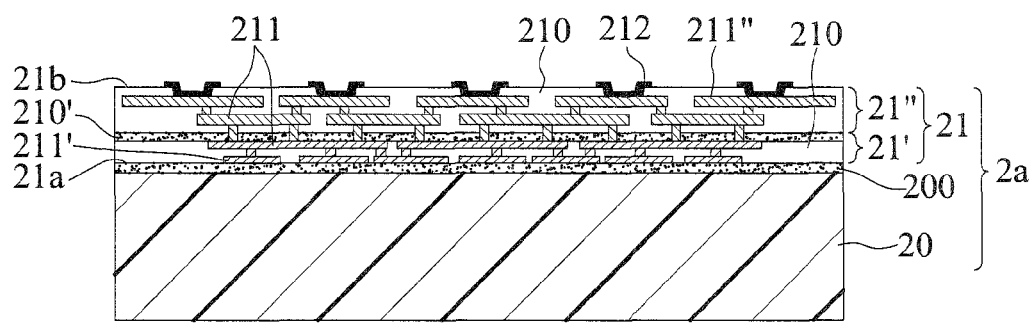

Referring to FIG. 2B, a circuit structure 21 is formed on the separation layer 200 of the carrier 20.

In the present embodiment, the circuit structure 21 has a first surface 21a bonded to the separation layer 200 and a second surface 21b opposite to the first surface 21a. The circuit structure 21 has a plurality of dielectric layers 210, a plurality of internal circuit layers 211, a first circuit layer 211' formed on the dielectric layer 210 of the first surface 21a, and a second circuit layer 211" formed on the dielectric layer 210 of the second surface 21b. The minimum trace width of the first circuit layer 211' is less than the minimum trace width of the second circuit layer 211". Further, a UBM (Under Bump Metallurgy) layer 212 is formed on the second circuit layer 211".

The circuit structure 21 is formed through an RDL (Redistribution Layer) process.

Generally, a circuit layer having a fine trace width of, for example, 0.7 um, is formed on the carrier 20 first. Then, a circuit layer having a greater trace width of, for example, 5 um, is formed, and thereafter, a circuit layer having a much greater trace width of, for example, 10 um, is formed. Since the circuit layer having fine trace width and the dielectric layer thereon are quite even, the evenness requirement for forming upper circuit layers thereon is met. Otherwise, if a circuit layer having a great trace width is formed first, since it cannot meet the evenness requirement, circuit layers having much less trace widths cannot be sequentially formed thereon, thus reducing the product reliability.

Preferably, if the trace width (L) is too small, for example, less than or equal to 1 um, a first circuit portion 21' (including an insulating layer 210') is formed first in a wafer process and then a second circuit portion 21" is formed in a back-end packaging process. The circuit structure 21 has the first circuit portion 21' bonded to the separation layer 200 and the second circuit portion 21" stacked on the first circuit portion 21'.

If the first circuit portion 21' has a trace width greater than or equal to 1 um, the wafer process for forming the first circuit portion 21' is optional. For example, since the dielectric layer used in the wafer process is made of silicon nitride or silicon oxide and formed through a chemical vapor deposition (CVD), it incurs a high fabrication cost. Therefore, a non-wafer process is usually used. In particular, a dielectric layer of polyimide or polybenzoxazole (PBO) is formed by coating between circuits for insulation, thereby reducing the fabrication cost.

The carrier 20, the separation layer 200 and the circuit structure 21 constitute a carrier structure 2a.

Figure 2C:
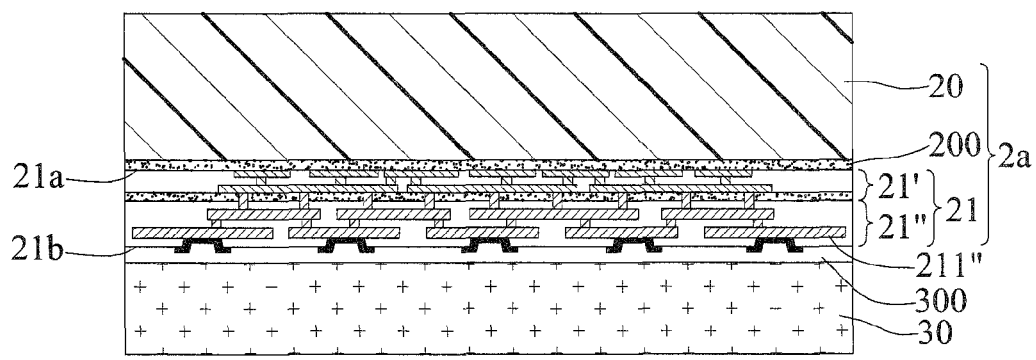

Referring to FIG. 2C, a carrier board 30 is disposed on the second surface 21b of the circuit structure 21.

In the present embodiment, the carrier board 30 is bonded to the circuit structure 21 through an insulating layer 300 such as an adhesive, and the surface of the carrier structure 2*a* having wide traces is covered by the insulating layer 300.

Figure 2D:
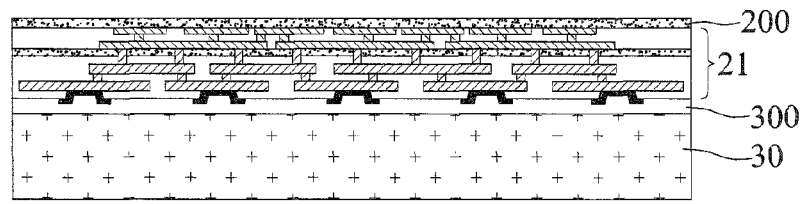

Referring to FIG. 2D, the carrier 20 is removed, leaving the separation layer 200 on the circuit structure 21.

In the present embodiment, if the carrier 20 is a silicon wafer, a large portion of the carrier 20 is removed by grinding first and then the remaining portion of the carrier 20 is removed by etching. The separation layer 200 serves as an etch stop layer. If the carrier 20 is made of glass, the separation layer 200 partially loses its adhesive property through heating or radiation such as UV radiation. As such, the carrier 20 is removed and the separation layer 200 is left to serve as an adhesive layer.

Figure 2E:
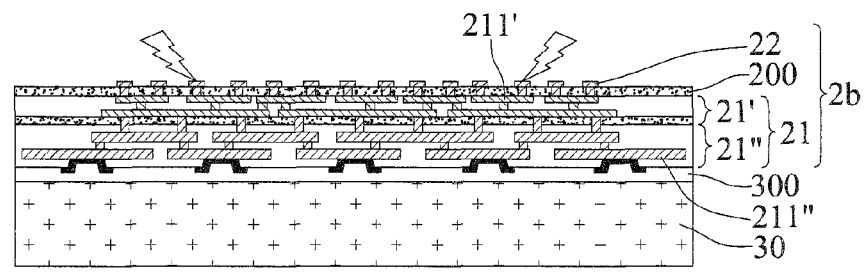
Figure 2E:
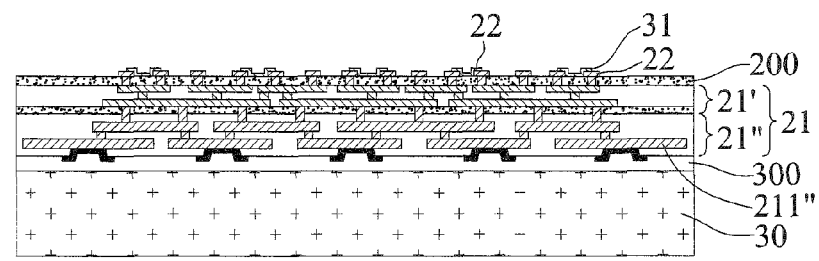

Referring to FIG. 2E, a metal layer 22 is formed on the separation layer 200 by electroplating, and the metal layer 22 is electrically connected to the first circuit layer 211' of the circuit structure 21. Then, an optional electrical test is performed to the metal layer 22 and the circuit structure 21.

In the present embodiment, the metal layer 22 is formed by electroplating. In particular, a conductive layer (not shown) is formed on the separation layer 200 first and then the metal layer 22 is formed on the conductive layer. The metal layer 22 is a patterned circuit layer, which has a plurality of conductive pads and conductive traces. Various processes such as RDL (Redistribution Layer) processes can be used for fabrication of circuits. Since they are well known in the art, detailed description thereof is omitted herein.

Then, a circuit test is performed. If the circuit structure 21 and the metal layer 22 are determined to be proper, known good dies, i.e., electronic elements 23 are mounted. As such, the invention prevents a final electronic package from being adversely affected by an improper circuit structure 21 or metal layer 22 as in the prior art, thereby improving the product yield.

In another embodiment, referring to FIG. 2E', before an electrical test is performed, a conductive layer 31 is formed on a portion of the metal layer 22 to form a circuit (a portion of the metal layer 22 is not in contact with the conductive layer 31 so as to prevent a short circuit from occurring). After the electrical test is performed, the conductive layer 31 is removed.

The metal layer 22, the separation layer 200 and the circuit structure 21 constitute a packaging substrate 2*b*.

Figure 2F:
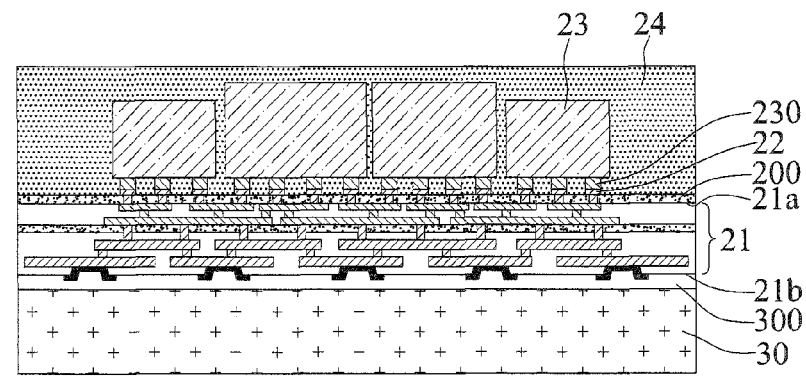

Referring to FIG. 2F, a plurality of electronic elements 23 are disposed on the first surface 21*a* of the circuit structure 21. Then, an encapsulant 24 is formed on the first surface 21*a* of the circuit structure 21 to encapsulate the electronic element 23.

In the present embodiment, each of the electronic elements 23 is an active element such as a semiconductor chip, a passive element such as a resistor, a capacitor or an inductor, or a combination thereof.

The electronic elements 23 are electrically connected to the circuit structure 21 in a flip-chip manner. In particular, the electronic elements 23 are electrically connected to the metal layer 22 through a plurality of solder bumps 230. Alternatively, the electronic elements 23 can be electrically connected to the metal layer 22 through wire bonding.

The encapsulant 24 is made of polyimide, a dry film, an epoxy resin or a molding compound.

Referring to FIG. 2G, the carrier board 30 and the insulating layer 300 are removed to expose the second surface 21*b* of the circuit structure 21. Then, a plurality of conductive elements 25 are formed on the UBM layer 212 of the second surface 21*b* of the circuit structure 21.

In the present embodiment, the conductive elements 25 are solder balls, metal bumps or metal pins, which are bonded to the UBM layer 212 and electrically connected to the second circuit layer 211".

The second surface 21*b* of the circuit structure 21 and the second circuit layer 211" serve as a ball mounting side for electrically connecting the electronic package 2 to a circuit board (not shown), thus dispensing with an additional packaging substrate so as to reduce the fabrication cost and the overall thickness of the final product.

In another embodiment, referring to FIG. 2G', to prevent a poor bonding between the conductive layer and the separation layer 200, an assisting layer 200' is formed on the separation layer 200 first and then the conductive layer 220 is formed on the assisting layer 200'. Thereafter, the metal layer 22 is formed on the assisting layer 200' and the separation layer 200.

In another embodiment, referring to FIG. 2G", another assisting layer 200" is further formed on the assisting layer 200'. A plurality of metal layers 22, 22' are formed on the assisting layers 200', 200" through the conductive layers 220', 220" by electroplating, and the outermost metal layer 22' is electrically connected to the electronic elements 23. The assisting layer 200" is made of polyimide, polybenzoxazole, $SiO_2$ or $SiN_x$.

According to the present invention, a plurality of electronic elements 23 having high I/O functions are directly disposed on the first circuit layer 211' of the circuit structure 21 so as to dispense with a packaging substrate having a core layer and hence reduce the thickness of the electronic package 2.

Further, since the first circuit layer 211' corresponds to the electronic elements 23 having high I/O count and fine trace width, the present invention does not need to increase the area of the circuit structure 21, thereby facilitating miniaturization of electronic products.

Furthermore, the present invention dispenses with the fabrication of TSVs and therefore reduces the fabrication cost.

In addition, an electrical test is performed on the circuit structure 21, and the electronic elements 23 are disposed after the circuits of the circuit structure 21 are determined to be proper. As such, the present invention reduces the loss of the electronic elements.

The present invention further provides an electronic package 2, which has: a circuit structure 21 having a first surface 21*a* and a second surface 21*b* opposite to the first surface 21*a*, wherein a first circuit layer 211' is formed on the first surface 21*a* of the circuit structure 21 and a second circuit layer 211" is formed on the second surface 21*b* of the circuit structure 21, the first circuit layer 211' having a minimum trace width less than that of the second circuit layer 211"; a separation layer 200 formed on the first surface 21*a* of the circuit structure 21; a metal layer 22 formed on the separation layer 200 and electrically connected to the first circuit layer 211'; at least an electronic element 23 disposed on the separation layer 200 and electrically connected to the metal layer 22; and an encapsulant 24 formed on the separation layer 200 to encapsulate the electronic element 23.

The electronic package 2 further has a plurality of conductive elements 25 formed on the second surface 21*b* of the circuit structure 21.

The present invention further provides a carrier structure 2*a*, which has: a carrier 20; a separation layer 200 bonded to the carrier 20; and a circuit structure 21 having a first surface 21*a* bonded to the separation layer 200 and a second surface 21*b* opposite to the first surface 21*a*, wherein a first circuit layer 211' is formed on the first surface 21a of the circuit structure 21 and a second circuit layer 211" is formed on the second surface 21b of the circuit structure 21, the first circuit layer 211' having a minimum trace width less than that of the second circuit layer 211".

The present invention further provides a packaging substrate 2b, which has: a circuit structure 21 having a first surface 21a and a second surface 21b opposite to the first surface 21a, wherein a first circuit layer 211' is formed on the first surface 21a of the circuit structure 21 and a second circuit layer 211" is formed on the second surface 21b of the circuit structure 21, the first circuit layer 211' having a minimum trace width less than that of the second circuit layer 211"; a separation layer 200 formed on the first surface 21a of the circuit structure 21; and a metal layer 22 formed on the separation layer 200 and electrically connected to the first circuit layer 211'.

The separation layer 200 is a thermal $SiO_2$ layer or an adhesive layer.

The metal layer 22 is a patterned circuit layer.

Further, at least an assisting layer 200', 200" is formed on the separation layer 200 in a manner that the metal layer 22, 22' is formed on the assisting layer 200', 200".

The present invention mainly involves disposing an electronic element having high I/O function on the circuit structure so as to eliminate the need of a packaging substrate having a core layer and thus reduce the thickness of the electronic package.

Since the first circuit layer corresponds to the electronic element having fine trace width and pitch and high I/O count, the present invention does not need to increase the area of the circuit structure, thereby facilitating miniaturization of electronic products.

Further, the present invention dispenses with the fabrication of TSVs and therefore reduces the fabrication cost.

Furthermore, an electrical test is performed on the circuit structure before disposing the electronic element so as to reduce material loss.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic package, comprising:
    a circuit structure having a first surface and a second surface opposite to the first surface, wherein a first circuit layer is formed on the first surface of the circuit structure and a second circuit layer is formed on the second surface of the circuit structure, the first circuit layer having a minimum trace width less than that of the second circuit layer, and wherein the minimum trace width of the first circuit layer is 0.7 to 5 µm, and the minimum trace width of the second circuit layer is 5 to 10 µm;
    a separation layer formed on the first surface of the circuit structure;
    a metal layer formed on the separation layer and electrically connected to the first circuit layer;
    an electronic element disposed on the first surface of the circuit structure and electrically connected to the metal layer; and
    an encapsulant formed on the circuit structure to encapsulate the electronic element.

2. The package of claim 1, wherein the separation layer is a thermal $SiO_2$ layer or an adhesive layer.

3. The package of claim 1, wherein the metal layer is a patterned circuit layer.

4. The package of claim 1, further comprising at least an assisting layer formed on the separation layer in a manner that the metal layer is formed on the assisting layer.

5. The package of claim 1, further comprising a plurality of conductive elements formed on the second surface of the circuit structure.

6. A carrier structure, comprising:
    a carrier;
    a separation layer bonded to the carrier; and
    a circuit structure having a first surface bonded to the separation layer and a second surface opposite to the first surface, wherein a first circuit layer is formed on the first surface of the circuit structure and a second circuit layer is formed on the second surface of the circuit structure, the first circuit layer having a minimum trace width less than that of the second circuit layer, and wherein the minimum trace width of the first circuit layer is 0.7 to 5 µm, and the minimum trace width of the second circuit layer is 5 to 10 µm.

7. The structure of claim 6, wherein the separation layer is a thermal SiO2 layer or an adhesive layer.

8. A packaging substrate, comprising:
    a circuit structure having a first surface and a second surface opposite to the first surface, wherein a first circuit layer is formed on the first surface of the circuit structure and a second circuit layer is formed on the second surface of the circuit structure, the first circuit layer having a minimum trace width less than that of the second circuit layer, and wherein the minimum trace width of the first circuit layer is 0.7 to 5 µm, and the minimum trace width of the second circuit layer is 5 to 10 µm;
    a separation layer formed on the first surface of the circuit structure; and
    a metal layer formed on the separation layer and electrically connected to the first circuit layer.

9. The substrate of claim 8, wherein the separation layer is a thermal $SiO_2$ layer or an adhesive layer.

10. The substrate of claim 8, wherein the metal layer is a patterned circuit layer.

11. The substrate of claim 8, further comprising at least an assisting layer formed on the separation layer in a manner that the metal layer is formed on the assisting layer.

* * * * *